(12) United States Patent
Pi

(10) Patent No.: US 12,719,001 B2
(45) Date of Patent: Aug. 25, 2026

(54) SWITCH AND ELECTRONIC DEVICE

(71) Applicant: GUANGDONG OPPO MOBILE TELECOMMUNICATIONS CORP., LTD., Dongguan (CN)

(72) Inventor: Weiwei Pi, Dongguan (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 11 days.

(21) Appl. No.: 19/005,259

(22) Filed: Dec. 30, 2024

(65) Prior Publication Data

US 2025/0140497 A1 May 1, 2025

Related U.S. Application Data

(63) Continuation of application No. PCT/CN2023/101464, filed on Jun. 20, 2023.

(30) Foreign Application Priority Data

Aug. 24, 2022 (CN) ........................ 202211023899.X

(51) Int. Cl.
*H01H 36/02* (2006.01)
*G01R 33/07* (2006.01)
(Continued)

(52) U.S. Cl.
CPC ............. *H01H 36/02* (2013.01); *G01R 33/07* (2013.01); *G01R 33/091* (2013.01);
(Continued)

(58) Field of Classification Search
CPC ........ H01H 36/02; H01H 15/04; H01H 15/10; H01H 2221/022; G01R 33/07; G01R 33/091; G01R 33/093
(Continued)

(56) References Cited

U.S. PATENT DOCUMENTS 6,332,278 B1 * 12/2001 Bezinge ................. G01B 3/205 33/708
2009/0051357 A1 2/2009 Sasaki
(Continued)

FOREIGN PATENT DOCUMENTS

CN 202149936 U 2/2012
CN 103808244 A 5/2014
(Continued)

OTHER PUBLICATIONS

Chinese First Office Action for Chinese Application No. 202211023899.X, mailed Feb. 27, 2025, 8 pages.
(Continued)

*Primary Examiner* — Michael R. Fin
(74) *Attorney, Agent, or Firm* — Ladas & Parry LLP

(57) ABSTRACT

A switch includes a fixed member, a sliding member and a processor, and the fixed member includes a sensor module. The sliding member is spaced apart from the fixed member and can be movable along a preset direction relative to the fixed member. The sliding member includes a magnetic head, and the magnetic head at least partially coincides with a projection of the sensor module, so that the sensor module can determine a position of the sliding member relative to the fixed member. The processor is electrically connected to the sensor module, and the processor enables the switch to be in a corresponding operating mode according to information of the position of the sliding member relative to the fixed member. An electronic device includes the switch.

18 Claims, 8 Drawing Sheets

(51) Int. Cl.

| | |
|---|---|
| ***G01R 33/09*** | (2006.01) |
| ***H01H 15/04*** | (2006.01) |
| ***H01H 15/10*** | (2006.01) |

(52) U.S. Cl.
CPC ........... *G01R 33/093* (2013.01); *H01H 15/04* (2013.01); *H01H 15/10* (2013.01); *H01H 2221/022* (2013.01)

(58) Field of Classification Search
USPC .......................................................... 307/116
See application file for complete search history.

(56) References Cited

U.S. PATENT DOCUMENTS

| | | | | |
|---|---|---|---|---|
| 2014/0100687 | A1 | 4/2014 | Ekstrom et al. | |
| 2021/0149272 | A1* | 5/2021 | Li | H04N 23/55 |

FOREIGN PATENT DOCUMENTS

| | | | |
|---|---|---|---|
| CN | 103903908 | B | 4/2016 |
| CN | 109819072 | A | 5/2019 |
| CN | 210183309 | U | 3/2020 |
| CN | 112747664 | A | 5/2021 |
| CN | 113701615 | A | 11/2021 |
| CN | 114508993 | A | 5/2022 |
| CN | 115394582 | A | 11/2022 |
| WO | 2009110359 | A1 | 9/2009 |

OTHER PUBLICATIONS

Chinese Second Office Action, Chinese Application No. 202211023899.X, mailed Nov. 20, 2025 (17 pages).

European Search Report, European Application No. 23856236.7, mailed Sep. 4, 2025 (18 pages).

International Search Report and Written Opinion, International Patent Application No. PCT/CN2023/101464, mailed Aug. 28, 2023 (15 pages).

* cited by examiner

A-A

SWITCH AND ELECTRONIC DEVICE

CROSS-REFERENCE TO RELATED APPLICATIONS

The present application is a continuation of International Patent Application No. PCT/CN2023/101464, filed Jun. 20, 2023, which claims priority to Chinese Patent Application No. 202211023899.X, filed Aug. 24, 2022, both of which are herein incorporated by reference in their entirety.

TECHNICAL FIELD

The present disclosure relates to the technical field of electronic devices, and in particular to a switch and an electronic device.

BACKGROUND

At present, a button of an electronic device, such as a mobile phone, usually uses an embedded push-button switch. The push-button switch has advantages of simple structure and convenient operation. However, the push-button switch is directly connected to an interior of the electronic device, which has high requirements for sealing of the electronic device.

SUMMARY OF THE DISCLOSURE

The present disclosure provides a switch configured for controlling a plurality of operating modes. The switch includes a fixed member, a sliding member, and a processor. The fixed member includes a sensor module. The sliding member is spaced apart from the fixed member and movable along a preset direction relative to the fixed member. The sliding member includes a magnetic head, the magnetic head at least partially overlaps with the sensor module, so that the sensor module is able to determine a position of the sliding member relative to the fixed member. The processor is electrically connected to the sensor module, and the processor makes the switch be in a corresponding operating mode according to the position of the sliding member relative to the fixed member.

The present disclosure further provides an electronic device including a switch and a middle frame. The switch includes a fixed member, a sliding member, and a processor. The fixed member includes a sensor module. The sliding member is spaced apart from the fixed member and movable along a preset direction relative to the fixed member. The sliding member includes a magnetic head, the magnetic head at least partially overlaps with the sensor module, so that the sensor module is able to determine a position of the sliding member relative to the fixed member. The processor is electrically connected to the sensor module, and the processor makes the switch be in a corresponding operating mode according to the position of the sliding member relative to the fixed member. The middle frame includes a middle plate and a side frame. The side frame extends from an edge of the middle plate, the side frame and the middle plate are enclosed to define an accommodating chamber, the fixed member and the processor of the switch are accommodated in the accommodating chamber, and the sliding member of the switch is disposed on the side frame.

BRIEF DESCRIPTION OF THE DRAWINGS

In order to more clearly describe the technical solutions in some embodiments of the present disclosure, hereinafter, the accompanying drawings that are used in the description of some embodiments will be briefly described. Obviously, the accompanying drawings in the description below merely show some embodiments of the present disclosure. For those of ordinary skill in the art, other accompanying drawings may be obtained based on these accompanying drawings without any creative efforts.

DETAILED DESCRIPTION

The present disclosure may be explained in detail by combining the accompanying drawings and embodiments. The following embodiments are only used to illustrate the present disclosure, but do not limit the scope of the present disclosure. Similarly, the following embodiments are only a part of the embodiments of the present disclosure, and not all embodiments. All other embodiments obtained by those of ordinary skill in the art without creative effort are within the scope of the present disclosure.

The reference to “embodiment” in the present disclosure means that, specific features, structures, or characteristics described in conjunction with some embodiments may be included in at least one embodiment of the present disclosure. The phrase appearing in various positions in the specification does not necessarily refer to the same embodiment, nor is it an independent or alternative embodiment that is mutually exclusive with other embodiments. Those of ordinary skill in the art explicitly and implicitly understand that the embodiments described in the present disclosure can be combined with other embodiments.

The terms "first", "second", and "third" in the present disclosure are only configured to describe and cannot be understood as indicating or implying relative importance or implicit indicating the quantity of technical features indicated. Therefore, features that are defined as "first", "second", and "third" may explicitly or implicitly include at least one of these features. In the description of the present disclosure, "multiple" means at least two, such as two, three, etc., unless otherwise expressly and specifically qualified.

The present disclosure provides a switch and an electronic device for improving sealing performance of the electronic device. The switch is a non-contact switch.

Figure 1:
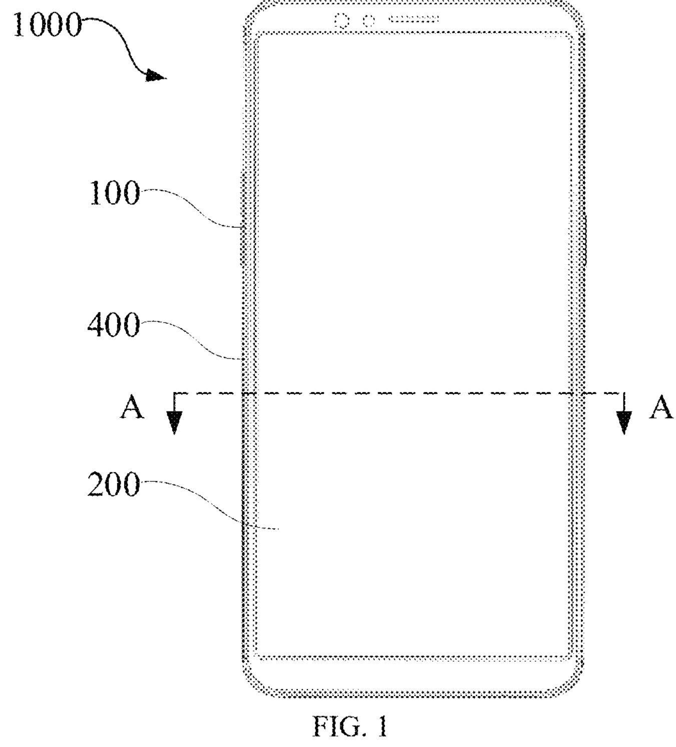
FIG. 1 is a front schematic view of an electronic device in some embodiments of the present disclosure.
Figure 2:
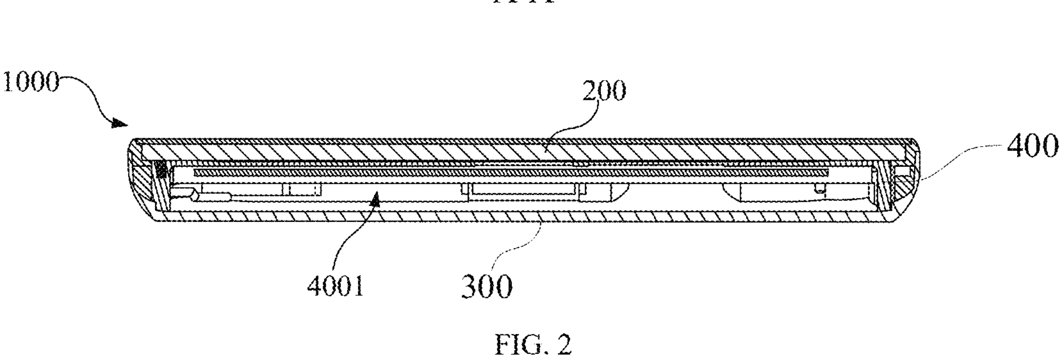
FIG. 2 is a cross-sectional schematic view of the electronic device of FIG. 1 in an A-A direction.

As illustrated in FIGS. 1 and 2, FIG. 1 is a front schematic view of an electronic device in some embodiments of the present disclosure, and FIG. 2 is a cross-sectional schematic view of the electronic device of FIG. 1 in an A-A direction. FIG. 1 is a three-dimensional schematic view of the electronic device in some embodiments of the present disclosure. The present disclosure provides an electronic device 1000. The electronic device 1000 may be any one (only one form is shown as an example in FIG. 1) of various types of computer system devices that are mobile or portable and perform wireless communication. The electronic device 1000 may be a mobile phone or a smart phone (such as a phone based on an iPhone™ or an Android™), a portable gaming device (such as a Nintendo DS™), a PlayStation Portable™, a Gameboy Advance™, or the iPhone™), a laptop computer, a PDA, a portable internet device, a music player, a data storage device, other handheld devices, or a headphone, etc. The electronic device 1000 may also be other wearable devices that need to be charged (such as an electronic bracelet, an electronic necklace, an electronic device, or an HMD of a smart watch).

The electronic device 1000 may also be any one of multiple electronic devices. The electronic device 1000 includes but not limited to, a cellular phone, a smart phone, other wireless communication devices, a personal digital assistant, an audio player, other media players, a music recorder, a video recorder, other media recorders, a radio, a medical device, a vehicle transport device, a calculator, a programmable remote control, a pager, the laptop computer, a desktop computer, a printer, a netbook computer, a personal digital assistant (PDA), a portable multimedia player (PMP), a motion picture experts group (MPEG-1 or MPEG-2) audio layer 3 (MP3) player, a portable medical device, a digital camera or their combinations, etc.

In some embodiments, the electronic device 1000 can perform multiple functions (such as playing music, displaying videos, storing images, and receiving and sending phone calls). If necessary, the electronic device 1000 may be a compact portable device, such as the cellular phone, the media player, other handheld devices, a wristwatch device, a pendant device, or an earpiece device, etc.

Figure 3:
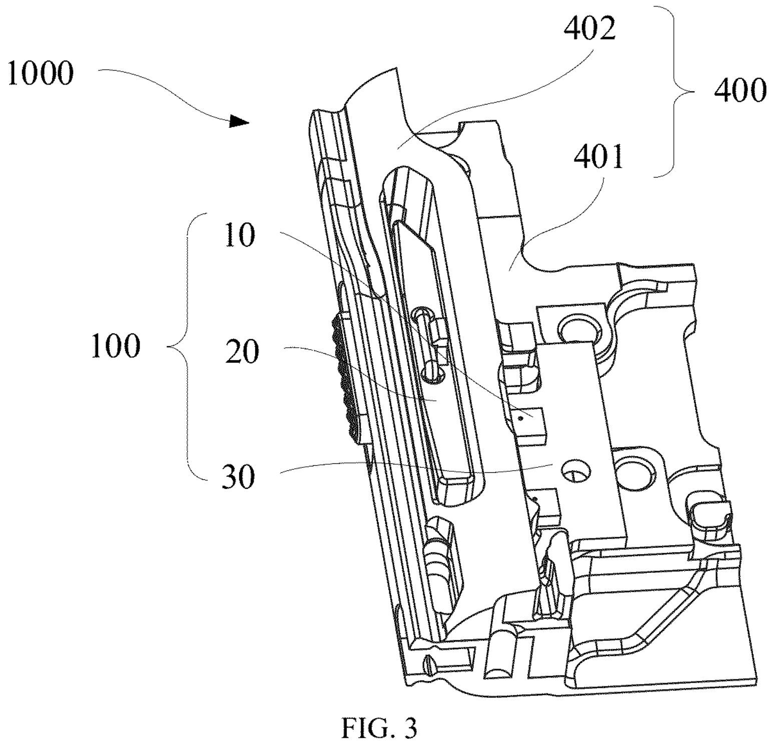
FIG. 3 is a partial structural schematic view illustrating cooperation of a non-contact switch and a middle frame of the electronic device of FIG. 1.

As illustrated in FIG. 3, FIG. 3 is a partial structural schematic view illustrating cooperation of a non-contact switch and a middle frame of the electronic device of FIG. 1. The electronic device 1000 may include a middle frame 400, a back cover 300, a display screen 200, and a non-contact switch 100. The back cover 300 is connected to a side surface of the middle frame 400, so that the back cover 300 is connected to the middle frame 400. The display screen 200 is disposed on a surface of the middle frame 400 away from the back cover 300. The middle frame 400 may be connected to the back cover 300 and the display screen 200. The middle frame 400, the back cover 300, and the display screen 200 are enclosed to form a storage space 4001. The storage space 4001 can be configured to accommodate structural components, such as a camera module, a mainboard, and a battery, etc., so that the electronic device 1000 can achieve corresponding functions. The structural components, such as the display screen 200, the camera module, etc., are electrically connected to the mainboard, the battery, etc. through a flexible printed circuit board (FPC), respectively. Therefore, the structural components can receive power supply from the battery and execute corresponding instructions under the control of the mainboard. A non-contact switch 100 is disposed on the middle frame 400 and electrically connected to the mainboard. The non-contact switch 100 is configured to allow the electronic device 1000 to be in a ring, mute, or do-not-disturb mode, or to control volume up, volume down, or volume hold, etc., which are not listed here.

The middle frame 400 may be configured to allow various electronic components required for the electronic device 1000 to be installed on the middle frame 400. The middle frame 400 may be enclosed together with the back cover 300 and the display screen 200 to form the storage space 4001. The storage space 4001 may be configured to accommodate electronic components such as an optical sensor, etc., so as to achieve functions such as fingerprint unlocking, automatic screen turning off, and brightness self-adjustment, etc. The storage space 4001 may be configured to accommodate the electronic components such as a microphone, a speaker, a flashlight, a circuit board, and a battery, so as to achieve functions such as voice communication, audio playback, and lighting, etc.

Figure 4:
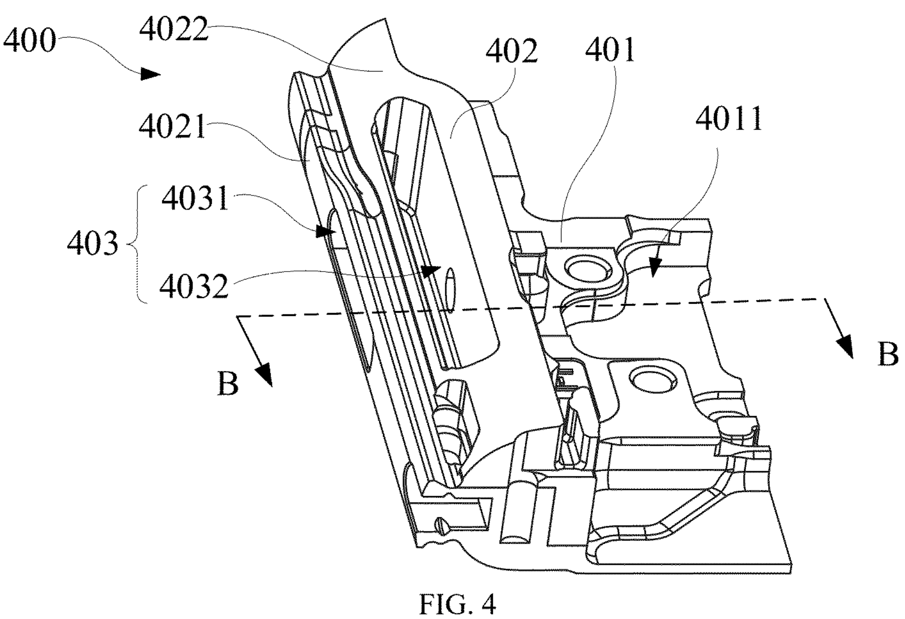
FIG. 4 is a three-dimensional structural schematic view of the middle frame of FIG. 3.
Figure 5:
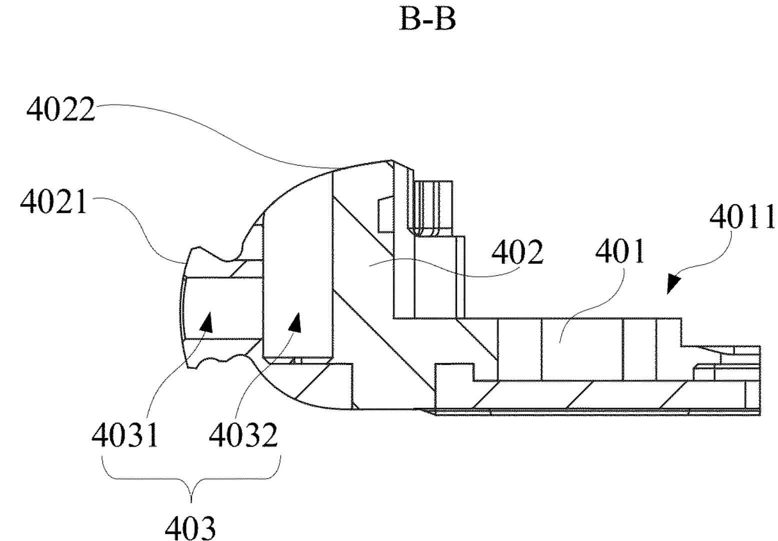
FIG. 5 is a cross-sectional structural schematic view of the middle frame of FIG. 4 in a B-B direction.

As illustrated in FIGS. 4 and 5, FIG. 4 is a three-dimensional structural schematic view of the middle frame of FIG. 3, and FIG. 5 is a cross-sectional structural schematic view of the middle frame of FIG. 4 in a B-B direction. In some embodiments, the middle frame 400 may include a middle plate 401 and a side frame 402, and the side frame 402 extends from an edge of the middle plate 401. The middle plate 401 and the side frame 402 are enclosed to form an accommodating chamber 4011. The camera module, the mainboard, the battery, and other structures are accommodated in the accommodating chamber 4011.

The side frame 402 may define a sliding groove 403, and partial structure of the non-contact switch 100 is slidably connected to the sliding groove 403, and partial structure of the non-contact switch 100 is accommodated in the accommodating chamber 4011 and fixed on the middle plate 401.

In some embodiments, the side frame 402 may include a first surface 4021 and a second surface 4022 that are disposed adjacent to each other. The first surface 4021 is disposed away from the accommodating chamber 4011, and the second surface 4022 is approximately parallel to the middle plate 401. The first surface 4021 defines a sliding slot 4031, and the second surface 4022 defines a card slot 4032 that is communicated with the sliding slot 4031. The sliding slot 4031 and the card slot 4032 form the sliding groove 403.

In some embodiments, the back cover 300 may be abutted against the second surface 4022 of the side frame 402, so that the back cover 300 can seal the card slot 4032 and prevent external water, dust, etc. from entering the accommodating chamber 4011 through the sliding slot 4031 and the card slot 4032 (i.e. the sliding groove 403). In addition, the back cover 300 is further configured to protect the mainboard, the battery, and other structures in the storage space 4001.

The display screen 200 can be configured to provide image display function for the electronic device 1000. When a user uses a shooting function of the electronic device 1000, the display screen 200 can present an imaging picture of the camera module for the user to observe and operate.

Figure 6:
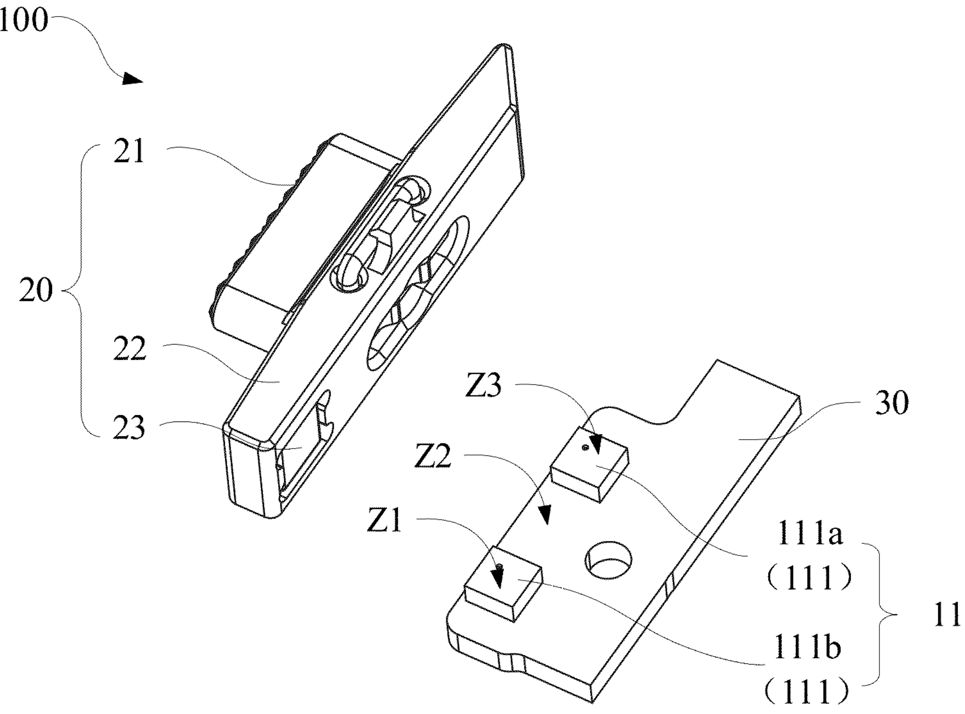
FIG. 6 is a three-dimensional structural schematic view of the non-contact switch of FIG. 3 in some embodiments.

As illustrated in FIG. 6, FIG. 6 is a three-dimensional structural schematic view of the non-contact switch of FIG. 3 in some embodiments. The non-contact switch 100 may include a fixed member 10, a sliding member 20, and a processor 30. The sliding member 20 can be slidable relative to the fixed member 10. In some embodiments, the fixed member 10 may include a sensor module 11, and the sliding member 20 may include a magnetic head 23. The magnetic head 23 moves relative to the sensor module 11, so that the sensor module 11 can sense a position of the magnetic head 23 relative to the sensor module 11 (i.e., a position of the sliding member 20 relative to the fixed member 10). The processor 30 is electrically connected to the sensor module 11. The processor 30 allows the non-contact switch 100 to be in a corresponding operating mode according to the position of the sliding member 20 relative to the fixed member 10.

In some embodiments, the fixed member 10 may be spaced apart from the sliding member 20, that is, the fixed member 10 and the sliding member 20 may be disposed in a non-contact manner. In some embodiments, the fixed member 10 is accommodated in the storage space 4001 and fixed to the middle plate 401. The sliding member 20 is clamped and accommodated in the sliding groove 403, so that the sliding member 20 can slide along a preset direction in the sliding groove 403. Therefore, the electronic device 1000 can be controlled to enter the corresponding operating mode without the sliding member 20 directly contacting with the fixed member 10. That is, for the non-contact switch 100 in the present disclosure, it is not necessary to consider sealing of the electronic device 1000, thereby making the structure of the electronic device 1000 simpler.

In some embodiments, the sliding member 20 may further include a sliding part 21 and a clamping part 22 connected to the sliding part 21, and the magnetic head 23 is disposed on the clamping part 22. The sliding part 21 is slidably connected to the sliding slot 4031 and protrudes from the first surface 4021, so as to facilitate sliding of the sliding member 20 by the user. The card holder 22 is clamped in the card slot 4032. On the one hand, the sliding part 21 is prevented from being detached from the sliding slot 4031, improving reliability of a connection between the sliding part 21 and the middle frame 400. On the other hand, the magnetic head 23 is fixed, so that the magnetic head 23 faces the storage space 4001 and is adjacent to the fixed member 10.

In some embodiments, the sensor module 11 may include at least one Hall sensor 111, the Hall sensor 111 may be disposed along the preset direction. When the sliding member 20 slides relative to the fixed member 10, the Hall sensor 111 can detect a magnetic field strength of the magnetic head 23 and determine the position of the sliding member 20 relative to the fixed member 10 according to the magnetic field strength of the magnetic head 23.

In some embodiments, the sensor module 11 may include two Hall sensors 111 (a first Hall sensor 111*a* and a second Hall sensor 111*b*), and the first Hall sensor 111*a* and the second Hall sensor 111*b* are spaced apart from each other along the preset direction. When the magnetic head 23 is disposed corresponding to the first Hall sensor 11*a*, that is, when the sliding member 20 is located at a first position Z1 of the fixed member 10, the non-contact switch 100 can be in a first operating mode. When the magnetic head 23 is located between the first Hall sensor 111*a* and the second Hall sensor 111*b*, that is, when the sliding member 20 is located at a second position Z2 of the fixed member 10, the non-contact switch can be in a second operating mode. When the magnetic head 23 is disposed corresponding to the second Hall sensor 111*b*, that is, when the sliding member 20 is located at a third position Z3 of the fixed member 10, the non-contact switch 100 is in a third operating mode.

In some embodiments, when the non-contact switch 100 is in the first operating mode, the electronic device 1000 can be in the ring mode. When the non-contact switch 100 is in the second operating mode, the electronic device 1000 can be in the do-not-disturb mode. When the non-contact switch 100 is in the third operating mode, the electronic device 1000 can be in the mute mode. In some embodiments, when the non-contact switch 100 is in the first operating mode, the electronic device 1000 can be in a volume up mode. When the non-contact switch 100 is in the second operating mode, the electronic device 1000 can be in a volume hold mode. When the non-contact switch 100 is in the third operating mode, the electronic device 1000 can be in a volume down mode.

Figure 7:
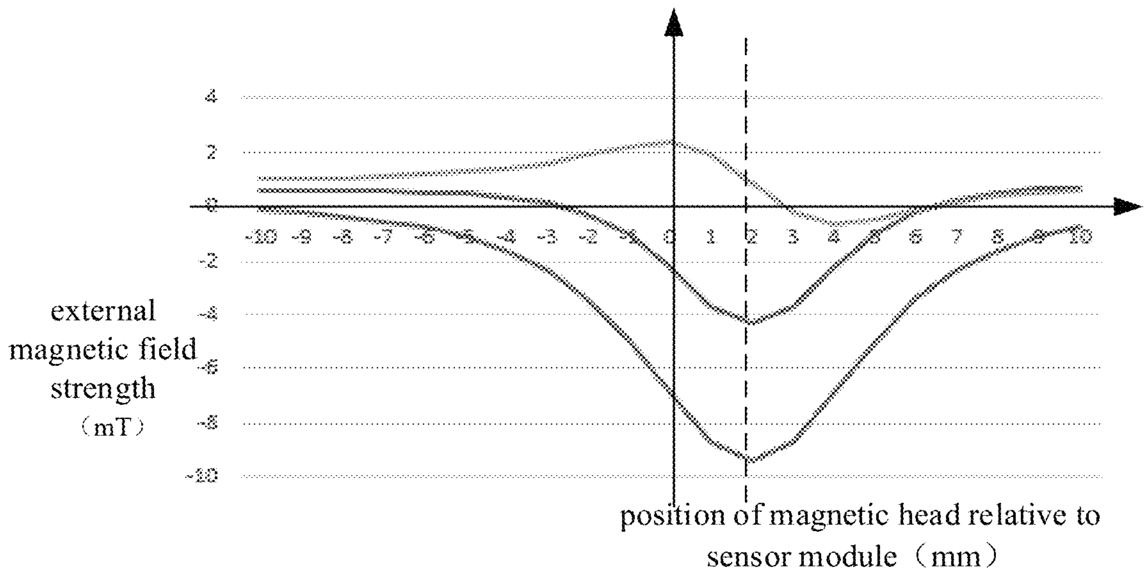
FIG. 7 is a schematic view illustrating magnetic field intensity changes in various directions of a first Hall sensor when a sliding member slides along a preset direction relative to a fixed member in FIG. 6.
Figure 8:
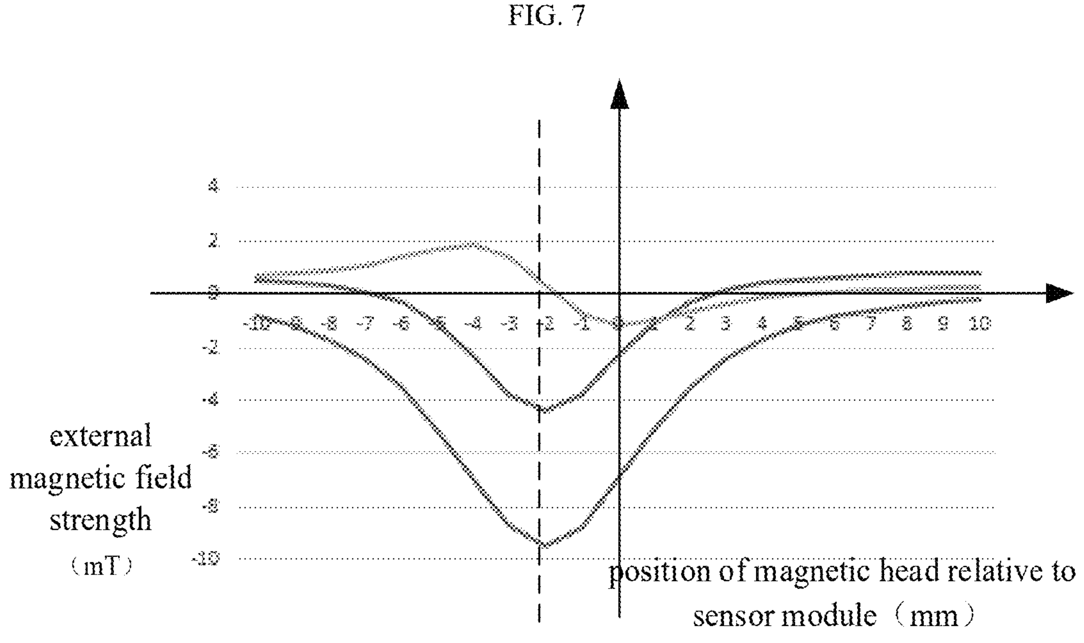
FIG. 8 is a schematic view illustrating magnetic field intensity changes in various directions of a second Hall sensor when the sliding member slides along the preset direction relative to the fixed member in FIG. 6.
Figure 9:
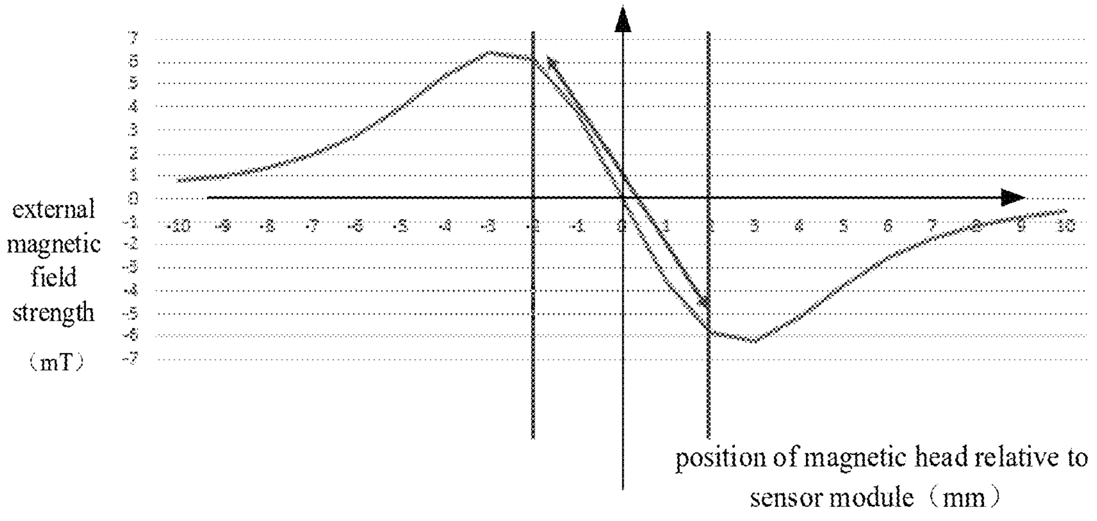
FIG. 9 is a schematic view illustrating a relationship between magnetic field changes of the first Hall sensor and the second Hall sensor and a sliding distance of the sliding member relative to the fixed member.

As illustrated in FIGS. 7 to 9. FIG. 7 is a schematic view illustrating magnetic field intensity changes in various directions of a first Hall sensor when a sliding member slides along a preset direction relative to a fixed member in FIG. 6, FIG. 8 is a schematic view illustrating magnetic field intensity changes in various directions of a second Hall sensor when the sliding member slides along the preset direction relative to the fixed member in FIG. 6, and FIG. 9 is a schematic view illustrating a relationship between magnetic field changes of the first Hall sensor and the second Hall sensor and a sliding distance of the sliding member relative to the fixed member. In some embodiments, as illustrated in FIGS. 7-9, a single axis Hall sensor is only sensitive to the magnetic field strength in a Z-axis direction, therefore, the Hall sensor only needs to detect the magnetic field strength in the Z-axis direction.

As illustrated in FIGS. 7 to 9, when the sliding member 20 is located at the first position Z1 of the fixed member 10, the magnetic field strength measured by the first Hall sensor 111*a* is the largest. As illustrated in FIG. 8, when the sliding member 20 is located at the third position Z3 of the fixed member 10, the magnetic field strength measured by the second Hall sensor 111*b* is the largest. When the sliding member 20 is located at the second position Z2 of the fixed member 10, the magnetic head 23 is located between the first Hall sensor 111*a* and the second Hall sensor 111*b*, as illustrated in FIG. 9.

As illustrated in FIGS. 7 to 9, when the sliding member 20 is located at the first position Z1, second position Z2, and third position Z3 of the fixed member 10, a magnetic field strength difference between adjacent Hall sensors 111 is only 5 mT. Considering shaking factors at different positions, the solution can only withstand approximately 3 mT of external magnetic field interference. When the external magnetic field interference exceeds 3 mT, the non-contact switch 100 can be abnormal, affecting the normal function of the electronic device 1000.

Figure 10:
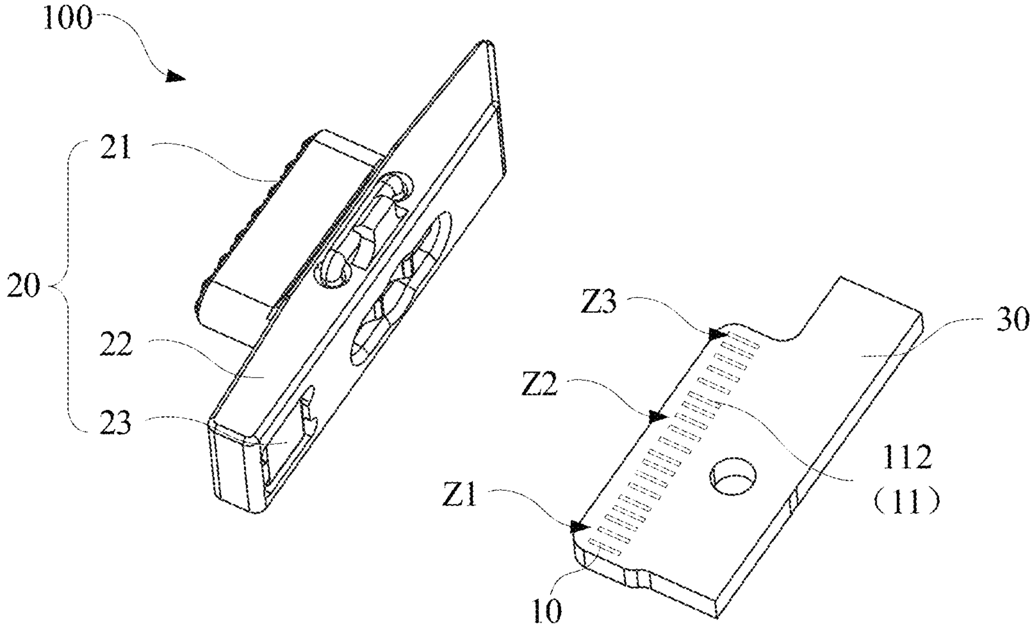
FIG. 10 is a three-dimensional structural schematic view of the non-contact switch of FIG. 3 in some embodiments.
Figure 11:
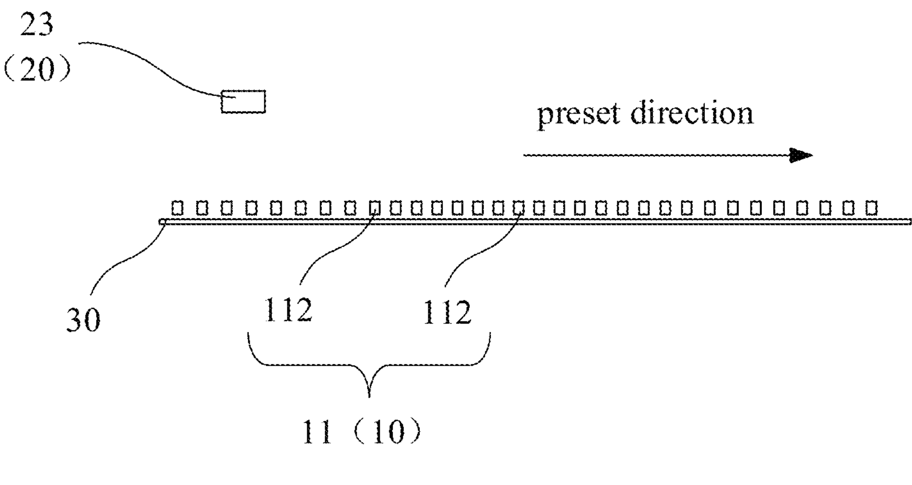
FIG. 11 is a structural schematic view of the non-contact switch of FIG. 10.

As illustrated in FIGS. 10 and 11, in some embodiments, the sensor module 11 includes multiple magnetoresistive sensors 112 disposed along the preset direction, and multiple magnetoresistive sensors 112 are sequentially connected in series. The sliding member 20 moves relative to the fixed member 10 along the preset direction, so that the magnetic head 23 sequentially passes by at least one magnetoresistive sensor 112. The magnetic head 23 magnetizes the magnetoresistive sensor 112 that is passed by the magnetic head 23 and changes a resistance value of the magnetoresistive sensor 112 that is passed by the magnetic head 23, thereby changing a total resistance value of the sensor module 11. The processor 30 determines the position of the sliding member 20 relative to the fixed member 10 according to the total resistance of the sensor module 11, and makes the non-contact switch 100 be in the corresponding operating mode. The magnetoresistive sensor 112 passed by the magnetic head 23 only includes the magnetoresistive sensor 112 passed during a movement process of the magnetic head 23, and does not include the current corresponding magnetoresistive sensor 112.

Figure 12:
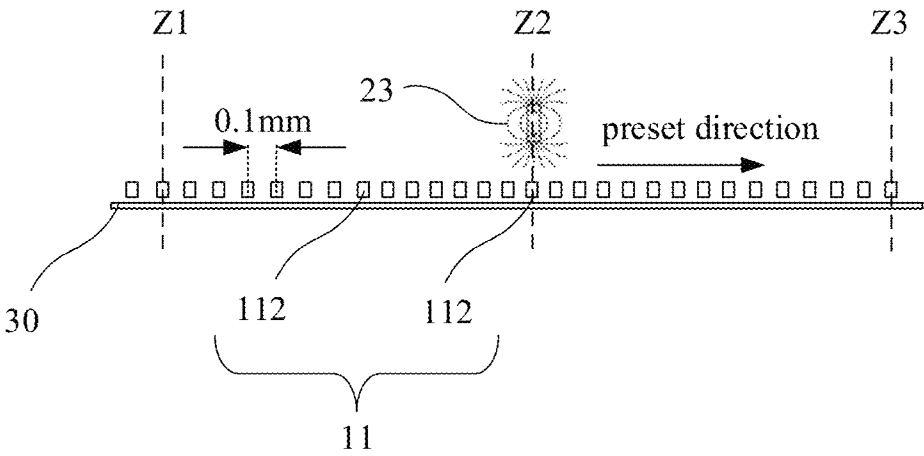
FIG. 12 is a structural schematic view of the non-contact switch of FIG. 11 in some embodiments.

As illustrated in FIG. 12, FIG. 12 is a structural schematic view of the non-contact switch of FIG. 11 in some embodiments. When the sliding member 20 is located at the first position Z1 of the fixed member 10, the total resistance value of the sensor module 11 is a first total resistance value. When the sliding member 20 is located at the second position Z2 of the fixed member 10, the total resistance value of the sensor module 11 is a second total resistance value. When the sliding member 20 is located at the third position Z3 of the fixed member 10, the total resistance value of the sensor module 11 is a third total resistance value. The second total resistance value is greater than the first total resistance value and less than the third total resistance value. It can be understood that a distance of the sliding member 20 relative to the fixed member 10 is mapped one-to-one with the total resistance value of the sensor module 11. That is, the distance of the sliding member 20 relative to the fixed member 10 is linearly related to the total resistance value of the sensor module 11. The processor 30 determines a moving distance of the sliding member 20 relative to the fixed member 10 according to the total resistance value of the sensor module 11. That is, the processor 30 determines the position of the sliding member 20 relative to the fixed member 10, so that the non-contact switch 100 is in the corresponding operating mode.

In some embodiments, when the total resistance value of the sensor module 11 is a first resistance value, that is, when the sliding member 20 is located at the first position Z1 of the fixed member 10, the non-contact switch 100 can be in the first operating mode. When the total resistance value of the sensor module 11 is a second resistance value, that is, when the sliding member 20 is located at the second position Z2 of the fixed member 10, the non-contact switch 100 can be in the second operating mode. When the total resistance value of the sensor module 11 is a third resistance value, that is, when the sliding member 20 is located at the third position Z3 of the fixed member 10, the non-contact switch 100 can be in the third operating mode.

In some embodiments, when the non-contact switch 100 is in the first operating mode, the electronic device 1000 can be in the ring mode. When the non-contact switch 100 is in the second operating mode, the electronic device 1000 can be in the do-not-disturb mode. When the non-contact switch 100 is in the third operating mode, the electronic device 1000 can be in the mute mode. In some embodiments, when the non-contact switch 100 is in the first operating mode, the electronic device 1000 can be in the volume up mode. When the non-contact switch 100 is in the second operating mode, the electronic device 1000 can be in the volume hold mode. When the non-contact switch 100 is in the third operating mode, the electronic device 1000 can be in the volume down mode.

Figure 13:
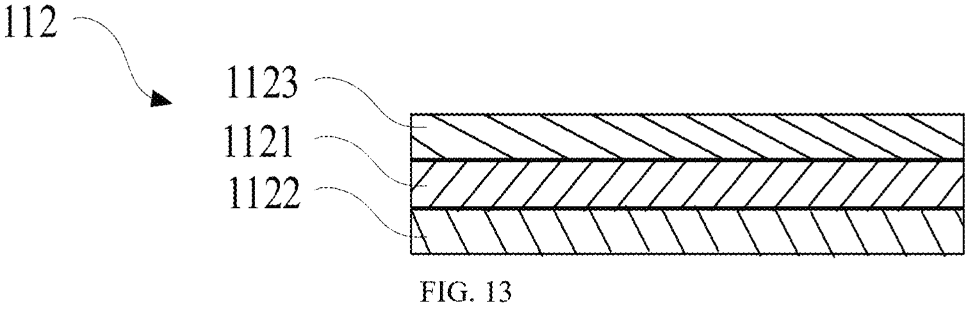
FIG. 13 is a cross-sectional schematic view of a magnetoresistive sensor of a sensor module of a displacement measurement structure of FIG. 11.

As illustrated in FIGS. 13, FIG. 13 is a cross-sectional schematic view of a magnetoresistive sensor of a sensor module of a displacement measurement structure of FIG. 11. In some embodiments, the magnetoresistive sensor 112 is a tunnel magnetoresistance effect (TMR) memory magnetoresistive sensor. The magnetoresistive sensor 112 is a thin film component made by advanced film making technology. The magnetoresistive sensor 112 may include a barrier layer 1121, a first magnetic layer 1122 (i.e., a fixed layer), and a second magnetic layer 1123 (i.e., a free layer). The first magnetic layer 1122 and the second magnetic layer 1123 are located on two opposite side surfaces of the barrier layer 1121, respectively. A magnetic field direction of the first magnetic layer 1122 is fixed, and the second magnetic layer 1123 can be magnetized by an external magnetic field (i.e., the magnetic head 23). A magnetic field direction of the second magnetic layer 1123 changes according to a magnetic field direction of the external magnetic field. In some embodiments, the resistance of the magnetoresistive sensor 112 is determined by the magnetic field direction of the second magnetic layer 1123 and a moving direction of the magnetic head 23 relative to the sensor module 11. In some embodiments, the first magnetic layer 1122 is disposed away from the magnetic head 23, so as to reduce influence of the magnetic head 23 on the first magnetic layer 1122. The second magnetic layer 1123 is disposed adjacent to the magnetic head 23, so that the magnetic head 23 can magnetize the second magnetic layer 1123 conveniently and quickly.

In some embodiments, when the magnetic field direction of the second magnetic layer 1123 is consistent with that of the first magnetic layer 1122, a resistance of the magnetoresistive sensor 112 is the smallest, and a current flowing through the barrier layer 1121 is the largest. At this time, the magnetoresistive sensor 112 has the first resistance value. When the magnetic field direction of the second magnetic layer 1123 is opposite (i.e., antiparallel) to that of the first magnetic layer 1122, the resistance of the magnetoresistive sensor 112 extremely increases, and almost no current flows through the barrier layer 1121. At this time, the magnetoresistive sensor 112 has the second resistance value. The magnetic field direction of the second magnetic layer 1123 is consistent or opposite to the moving direction of the magnetic head 23. In some embodiments, the magnetic field direction of the second magnetic layer 1123 can be consistent with the moving direction of the magnetic head 23, and the magnetoresistive sensor 112 has the first resistance value. The magnetic field direction of the second magnetic layer 1123 can be opposite to the moving direction of the magnetic head 23, and the magnetoresistive sensor 112 has the second resistance value. The first resistance value is less than the second resistance value.

Figure 14:
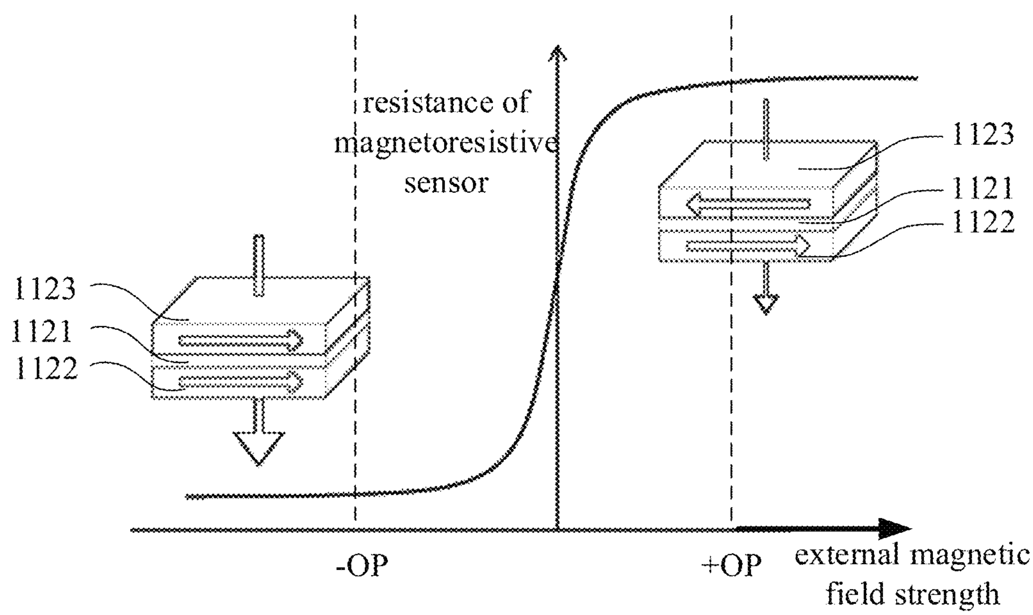
FIG. 14 is an axial schematic view illustrating a resistance of the magnetoresistive sensor varying with an external magnetic field.

As illustrated in FIG. 14, FIG. 14 is an axial schematic view illustrating a resistance of the magnetoresistive sensor varying with an external magnetic field. As illustrated in FIG. 14, when the magnetic field direction of the second magnetic layer 1123 is consistent with the magnetic field direction of the first magnetic layer 1122 under a magnetization effect of the external magnetic field, and a magnetic field strength of the external magnetic field is greater than a preset magnetic field strength (i.e., on a left side of a –OP value of FIG. 14), the magnetoresistive sensor 112 has the first resistance value $R_L$ (i.e., the minimum resistance value). Even if the magnetic field strength of the external magnetic field continues to increase, the resistance value of the magnetoresistive sensor 112 is still the first resistance value $R_L$. When the magnetic field direction of the second magnetic layer 1123 is opposite to the magnetic field direction of the first magnetic layer 1122 under the magnetization effect of the external magnetic field, and the magnetic field strength of the external magnetic field is greater than the preset magnetic field strength (i.e., on a right side of a +OP value of FIG. 14), the magnetoresistive sensor 112 has the second resistance value $R_h$ (i.e., the maximum resistance value). Even if the magnetic field strength of the external magnetic field continues to increase, the resistance value of the magnetoresistive sensor 112 is still the second resistance value $R_h$. That is, when the magnetic field strength of the magnetic head 23 is greater than the preset magnetic field strength, the moving direction of the magnetic head 23 relative to the sensor module 11 changes, and the resistance value of the magnetoresistive sensor 112 that is passed by the magnetic head 23 can be switched between the first resistance value and the second resistance value. In some embodiments, when the magnetic head 23 moves along the preset direction and the magnetic field strength of the magnetic head 23 is greater than the preset magnetic field strength, the magnetoresistive sensor 112 has the first resistance value $R_L$. When the magnetic head 23 moves along the opposite direction of the preset direction and the magnetic field strength of the magnetic head 23 is greater than the preset magnetic field strength, the magnetoresistive sensor 112 has the second resistance value $R_h$.

When the magnetic field strength of the external magnetic field is less than the preset magnetic field strength, that is, between the −OP value and the +OP value, the resistance value of the magnetoresistive sensor 112 roughly changes linearly. It can be understood that the magnetic field strength of the magnetic head 23 is usually greater than the preset magnetic field strength, therefore, a situation where the magnetic field strength of the external magnetic field is between the −OP value and the +OP value can be omitted.

In some embodiments, when the magnetic field strength of the magnetic head 23 is greater than the preset magnetic field strength, that is, outside a range from the −OP value to the +OP value, the resistance value of the magnetoresistive sensor 112 can be maintained in a memory resistance state. That is, even if there is no power supply, the resistance value of the magnetoresistive sensor 112 does not change, and the resistance value of the magnetoresistive sensor 112 has a physical memory function. In some embodiments, when the magnetic field direction of the second magnetic layer 1123 is consistent with the magnetic field direction of the first magnetic layer 1122 under the magnetization effect of the external magnetic field, and the magnetic field strength of the external magnetic field is greater than the preset magnetic field strength (i.e., on the left side of the −OP value of FIG. 14), the magnetoresistive sensor 112 has the first resistance value $R_L$ (i.e., the minimum resistance value). When the magnetic field direction of the second magnetic layer 1123 is opposite to the magnetic field direction of the first magnetic layer 1122 under the magnetization effect of the external magnetic field, and the magnetic field strength of the external magnetic field is greater than the preset magnetic field strength (i.e., on the right side of the +OP value of FIG. 14), the magnetoresistive sensor 112 has the second resistance value $R_h$ (i.e., the maximum resistance value). The magnetic field strength of the external magnetic field is usually much less than the magnetic field strength applied by the magnetic head 23. In some embodiments, the magnetic field strength applied by the magnetic head 23 is usually 10 times or 100 times that of the external interference magnetic field. As long as the strength of the external interference magnetic field is less than the preset magnetic field strength, the external interference magnetic field has no effect on accuracy of a displacement measurement structure. That is, compared with related arts, anti-magnetic interference capability of the displacement measurement structure in the embodiments of the present disclosure is improved by more than 10 times.

As illustrated in FIG. 12, in some embodiments, the first position Z1 and the third position Z3 are located at two opposite ends of the sensor module 11, and the second position Z2 is located in a middle position between the first position Z1 and the third position Z3. When a distance between the first position Z1 and the second position Z2 is approximately 1.4 mm, and a distance between the second position Z2 and the third position Z3 is 1.4 mm, a length of the sensor module 11 is greater than 2.8 mm.

Taking the sensor module 11 with a length of 3.0 mm (actual effective monitoring length of 2.9 mm) as an example, the sensor module 11 may include 30 magnetoresistive sensors 112, a distance between centers of two adjacent magnetoresistive sensors 112 is 0.1 mm. In some embodiments, arranged from left to right, a position of a first magnetoresistive sensor corresponds to a 0 mm position, a position of a second magnetoresistive sensor corresponds to a 0.1 mm position, and so on. A position of a 30th magnetoresistive sensor corresponds to a 2.9 mm position. That is, multiple magnetoresistive sensors 112 are arranged at equal intervals along the preset direction, so that an effective monitoring distance of the sensor module 11 is 0.1 mm*(30−1)=2.9 mm, and displacement resolution of the sensor module 11 is 0.1 mm.

The first position Z1 is located at the 0.1 mm position of the sensor module 11 (i.e., as illustrated in FIG. 12, arranged from left to right, the position of the second magnetoresistive sensor 112). The second position Z2 is located at a 1.5 mm position of the sensor module 11 (i.e., as illustrated in FIG. 12, arranged from left to right, the position of a 16th magnetoresistive sensor 112). The third position Z3 is located at the 2.9 mm position of the sensor module 11 (i.e., as illustrated in FIG. 12, arranged from left to right, the position of a 30th magnetoresistive sensor 112; or arranged from right to left, the position of the first magnetoresistive sensor 112).

In some embodiments, when the magnetic head 23 moves from a first end to a second end of the sensor module 11, that is, when the magnetic head 23 moves from the first position Z1 to the third position Z3, the resistance value of the magnetoresistive sensor 112 that passed by the magnetic head 23 is switched from the first resistance value $R_L$ to the second resistance value $R_h$ and maintains memory. When the magnetic head 23 moves from the second end to the first end of the sensor module 11, that is, when the magnetic head 23 moves from the third position Z3 to the first position Z1, the resistance value of the magnetoresistive sensor 112 that passed by the magnetic head 23 is switched from the second resistance value $R_h$ to the first resistance value $R_L$ and maintains memory. That is, the relative displacement between the magnetic head 23 and the sensor module 11 is linearly related to the resistance change value of the sensor module 11. In some embodiments, the greater the resistance change of the sensor module 11, the more magnetoresistive sensors 112 the magnetic head 23 passes by, and the greater the relative displacement between the magnetic head 23 and the sensor module 11. In some embodiments, when the magnetic head 23 moves from the first position Z1 to the second position Z2, as illustrated in FIG. 12, the magnetic head 23 passes by the second magnetoresistive sensor 112 to the 16th magnetoresistive sensor 112 that are arranged from left to right, 1.4/0.1=14, and the resistance values of fourteen magnetoresistive sensors 112 on the left side are switched from the first resistance value $R_L$ to the second resistance value $R_h$, while the resistance values of the magnetoresistive sensors 112 at other positions are still the first resistance value $R_L$. Therefore, an overall resistance of the sensor module 11 is R=15 $R_h$+15 $R_L$. In some embodiments, when the magnetic head 23 moves from the second position Z2 to the first position Z1, as illustrated in FIG. 12, the magnetic head 23 passes by a 15th magnetoresistive sensor 112 to the second magnetoresistive sensor 112 that are arranged from left to right, 1.4/0.1=14, the resistance values of the fourteen magnetic sensors 112 on the left side are switched from the second resistance value $R_h$ to the first resistance value $R_L$, while the resistance values of the magnetoresistive sensors 112 (fifteen magnetoresistive sensors 112) at other positions are still the first resistance value $R_L$. Only the magnetoresistive sensor 112 (i.e. the first one from left to right) on the left side of the first position Z1 still has the last memory, and the resistance value is the second resistance value $R_h$. Therefore, the overall resistance of the sensor module 11 is R=1 $R_h$+29 $R_L$.

In some embodiments, regardless of whether the magnetic head 23 moves to the left or the right, the magnetoresistive sensor 112 corresponding to the current position of the magnetic head 23 does not change. In some embodiments, the magnetic field direction of the magnetic head 23 is perpendicular to the second magnetic layer 1123 of the magnetoresistive sensor 112, so that the magnetic field direction of the second magnetic layer 1123 of the sensor module 11 magnetized by the magnetic head 23 is perpendicular to the magnetic field direction of the first magnetic layer 1122. That is, the magnetic field direction of the second magnetic layer 1123 is neither the same as nor opposite to that of the first magnetic layer 1122, and the resistance value of the magnetoresistive sensor 112 does not change. When the magnetic head 23 moves to the left or the right, on a side in the moving direction of the magnetic head 23 the magnetic field direction of the magnetic head 23 is either consistent with or opposite to the magnetic field direction of the second magnetic layer 1123 of the magnetoresistive sensor 112, so that the resistance of the magnetoresistive sensor 112 passed by the magnetic head 23 can change.

That is, when the sliding member 20 is located at the first position Z1 of the fixed member 10 (i.e., the 0.1 mm position of the sensor module 11), the overall resistance of the sensor module 11 is R=1 $R_h$+29 $R_L$. When the sliding member 20 is located at the second position Z2 of the fixed member 10 (i.e., the 1.5 mm position of the sensor module 11), the overall resistance of the sensor module 11 is R=15 $R_h$+15 $R_L$. When the sliding member 20 is located at the third position Z3 of the fixed member 10 (i.e., the 2.9 mm position of the sensor module 11), the overall resistance of the sensor module 11 is R=29 $R_h$+1 $R_L$.

In some embodiments, when the magnetic head 23 is at the first position Z1 and the 0.1 mm position, the overall resistance of the sensor module 11 is R=1*600+29*300=9.3 KΩ. When the magnetic head 23 is at the second position Z2 and the 1.5 mm position, the overall resistance of the sensor module 11 is R=15*300+15*600=13.5 KΩ. When the magnetic head 23 is at the third position Z3 and the 2.9 mm position, the overall resistance of the sensor module 11 is R=29*600+1*300=17.7 KΩ.

In some embodiments, considering that a mating position tolerance between adjacent positions is 0.2 mm, when the resistance ranges from 9.9 KΩ to 9 KΩ, it is judged as the first position Z1. When the resistance ranges from 14.1 KΩ to 12.9 KΩ, it is judged as the second position Z2. When the resistance ranges from 18 KΩ to 17.1 KΩ, it is judged as the third position Z3. A large gap between the resistance values of the sensor module 11 when the sliding member 20 is located at different positions, it is easy to distinguish.

In some embodiments, the magnetic field strength applied by the magnetic head 23 is usually 10 times or 100 times that of the external interference magnetic field. As long as the strength of the external interference magnetic field is less than the preset magnetic field strength, the external interference magnetic field has no effect on the accuracy of the displacement measurement structure. That is, the displacement measurement structure in the embodiments of the present disclosure has excellent anti-magnetic interference capability.

In some embodiments when the magnetoresistive sensors 112 are disposed at equal intervals, the resistance change values of the magnetoresistive sensors 112 are linearly related to the relative displacements between the magnetic head 23 and the sensor module 11. In some embodiments, the first position Z1, the second position Z2, and the third position Z3 are disposed at equal intervals.

In some embodiments, the distance between adjacent magnetoresistive sensors 112 may be equal, unequal, or partially equal, without specific limitations. Correspondingly, the first position Z1, the second position Z2, and the third position Z3 may be disposed at equal intervals or according to requirements, without specific restrictions.

Figure 15:
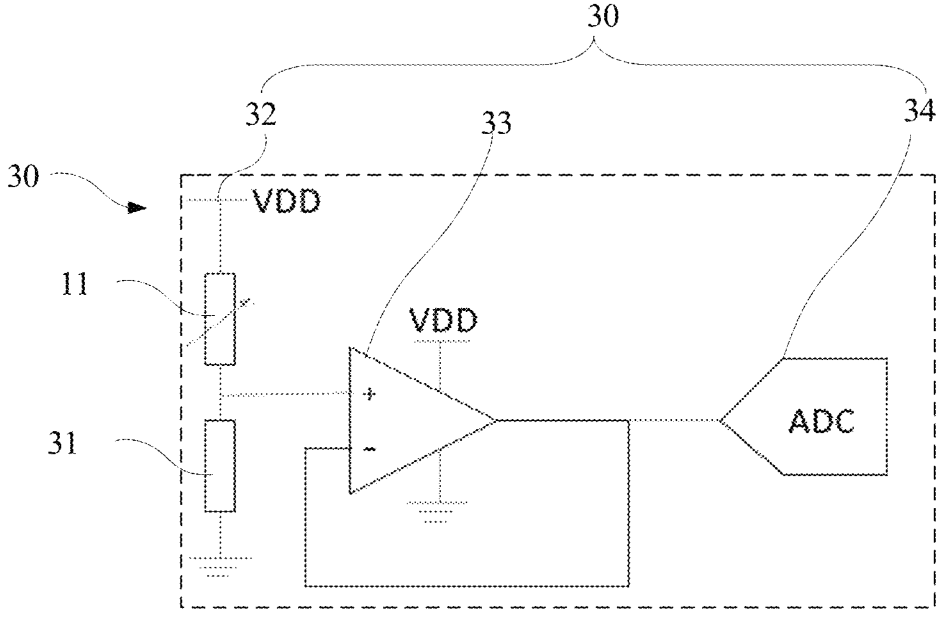
FIG. 15 is a circuit schematic view of a processor of the non-contact switch of FIG. 11.

As illustrated in FIG. 15, FIG. 15 is a circuit schematic view of a processor of the non-contact switch of FIG. 11. The processor 30 is configured to measure the total resistance of the sensor module 11. In some embodiments, the processor 30 may include a fixed resistor 31 and an external power supply 32. The fixed resistor 31 is connected in series with the sensor module 11. A positive pole of the external power supply 32 is electrically connected to an external sensor, and a negative pole of the external power supply 32 is electrically connected to the fixed resistor 31. By measuring voltage division of the fixed resistor 31, the total resistance value of the sensor can be determined, thereby determining the relative displacement of the magnetic head 23 relative to the sensor module 11.

The sensor module 11 may further include an operational amplifier 33 and an analog-to-digital converter 34. Due to high resistance of the sensor module 11, a voltage division value of the fixed resistor 31 is relatively small. The operational amplifier 33 is configured to amplify voltages of two terminals of the fixed resistor 31, making the measurement of the resistance value of the sensor module 11 more accurate. The analog-to-digital converter 34 is configured to convert an analog signal measured by the operational amplifier 33 into a digital signal.

The magnetic head 23 is one of a permanent magnet and an electromagnet. In some embodiments, a material of the magnetic head 23 is the permanent magnet, so as to reduce electrical connections with other structures and simplify the structure of the electronic device 1000.

In some embodiments, the processor 30 may be one of a circuit board or a flexible circuit board. The processor 30 may be integrated with the sensor module and fixed on the middle frame 400 (such as the middle plate or the side frame), or the processor 30 may be a part of the mainboard, without specific limitations.

In the non-contact switch 100 provided by the embodiments of the present disclosure, the sliding member 20 is spaced apart from the fixed member 10, and the sliding member 20 moves along the preset direction relative to the fixed member 10. By disposing the sensor module 11 on the fixed member 10 and disposing the magnetic head 23 on the sliding member 20, the sensor module 11 can determine the position of the sliding member 20 relative to the fixed member 10. The processor 30 makes the non-contact switch 100 be in the corresponding operating mode according to the position of the sliding member 20 relative to the fixed member 10. In the non-contact switch 100 provided by the present disclosure, the sliding member 20 does not need to be in direct contact with the fixed member 10, which is beneficial for improving the sealing performance of the electronic device 1000.

Figure 16:
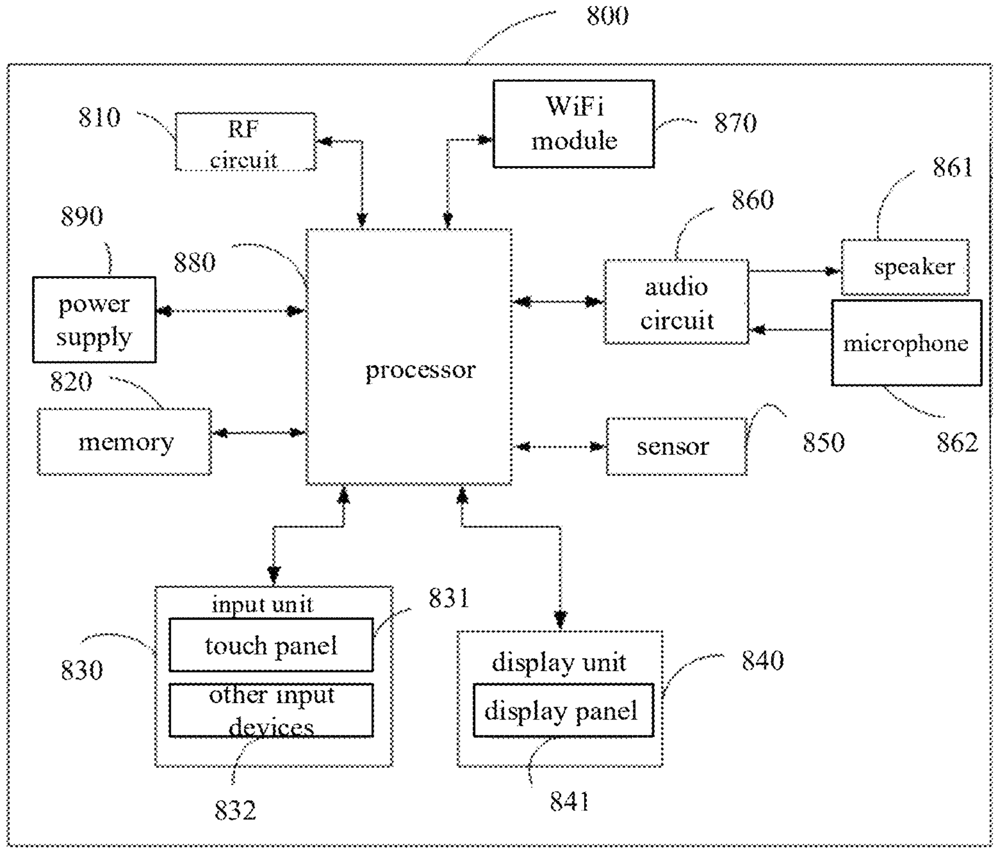
FIG. 16 is a structural schematic view of an electronic device in some embodiments of the present disclosure.

As illustrated in FIG. 16, FIG. 16 is a structural schematic view of an electronic device in some embodiments of the present disclosure. The present disclosure further provides an electronic device 800. The electronic device 800 includes an RF (radio frequency) circuit 810, a memory 820, an input unit 830, a display unit 8, a sensor 850, an audio circuit 860, a WiFi module 870, a processor 880, and a power supply 890, etc. The RF circuit 810, the memory 820, the input unit 830, the display unit 8, the sensor 850, the audio circuit 860, and the WiFi module 870 are connected to the processor 880, respectively. The power supply 890 is configured to provide electrical energy to the entire electronic device 800.

In some embodiments, the RF circuit 810 is configured for receiving and transmitting signals. The memory 820 is configured to store data instruction information. The input unit 830 is configured for inputting information, and the input unit 830 may include a touch panel 831 and other input devices 832 such as an operation button. The display unit 8 may include a display panel 841, etc. The sensor 850 includes an infrared sensor, a laser sensor, etc., and configured to detect a user proximity signal, a distance signal, etc. A speaker 861 and a microphone 862 are connected to processor 880 through the audio circuit 860, and configured for receiving and transmitting sound signals. The WiFi module 870 is configured for receiving and transmitting WiFi signals, and the processor 880 is configured for processing data information of the electronic device.

In the non-contact switch provided by the embodiments of the present disclosure, the sliding member is spaced apart from the fixed member and moves along the preset direction relative to the fixed member. By disposing the sensor module on the fixed member and disposing the magnetic head on the sliding member, the sensor module can determine the position of the sliding member relative to the fixed member. The processor makes the non-contact switch be in the corresponding operating mode according to the position of the sliding member relative to the fixed member. In the non-contact switch provided by the present disclosure, the sliding member is slidably connected to the side frame of the middle frame, the fixed member is connected to the middle plate of the middle frame, and the side frame is sandwiched between the sliding member and the fixed member, so that the sliding member does not need to be in direct contact with the fixed member. It is not necessary to define a through-hole in the side frame for connecting the sliding member to the fixed member, which is conducive to improving the sealing performance of the electronic device.

The above embodiments are only some embodiments of the present disclosure, and are not intended to limit the protection scope of the present disclosure. Any equivalent structure or equivalent flow transformation made by using the contents and the accompanying drawings of the present disclosure, or directly or indirectly applied to other related technical fields, is included in the protection scope of the present disclosure.

What is claimed is:

1. A switch, comprising:

a fixed member, comprising a sensor module;

a sliding member, spaced apart from the fixed member and movable along a preset direction relative to the fixed member; wherein the sliding member comprises a magnetic head, and the magnetic head at least partially overlaps with the sensor module, so that the sensor module is able to determine a position of the sliding member relative to the fixed member; and a processor, electrically connected to the sensor module; wherein the processor makes the switch be in a corresponding operating mode according to the position of the sliding member relative to the fixed member;

wherein the sensor module comprises a plurality of magnetoresistive sensors disposed along the preset direction, and the plurality of magnetoresistive sensors are sequentially connected in series;

the sliding member moves relative to the fixed member along the preset direction, so that the magnetic head sequentially passes by at least one magnetoresistive sensor;

the magnetic head magnetizes the at least one magnetoresistive sensor that is passed by the magnetic head and changes a resistance value of the at least one magnetoresistive sensor that is passed by the magnetic head, so that a total resistance value of the sensor module changes;

the processor determines the position of the sliding member relative to the fixed member according to the total resistance value of the sensor module, and makes the switch be in the corresponding operating mode; and a distance of the sliding member relative to the fixed member is linearly related to the total resistance value of the sensor module.

2. The switch according to claim 1, wherein the plurality of magnetoresistive sensors are disposed at equal intervals.

3. The switch according to claim 2, wherein when the sliding member is located at a first position of the fixed member, the switch is in a first operating mode;

when the sliding member is located at a second position of the fixed member, the switch is in a second operating mode; and when the sliding member is located at a third position of the fixed member, the switch is in a third operating mode.

4. The switch according to claim 3, wherein the first position, the second position, and the third position are disposed at equal intervals along the preset direction.

5. The switch according to claim 1, wherein each of the plurality of magnetoresistive sensors comprises a barrier layer, a first magnetic layer, and a second magnetic layer;

the barrier layer comprises two opposite side surfaces, the first magnetic layer is located on one of the two opposite side surfaces, and the second magnetic layer is located on the other of the two opposite side surfaces;

the magnetic head is configured to magnetize the second magnetic layer, and a magnetic field strength of the magnetic head is greater than a preset magnetic field strength.

6. The switch according to claim 5, wherein when a magnetic field direction of the second magnetic layer is consistent with that of the first magnetic layer, each of the plurality of magnetoresistive sensors has a first resistance value; and when the magnetic field direction of the second magnetic layer is opposite to that of the first magnetic layer, each of the plurality of magnetoresistive sensors has a second resistance value.

7. The switch according to claim 6, wherein the magnetic field direction of the second magnetic layer is consistent or opposite to a moving direction of the magnetic head, and the first resistance value is less than the second resistance value.

8. The switch according to claim 6, wherein the magnetic head is one of a permanent magnet and an electromagnet.

9. The switch according to claim 1, wherein the sensor module comprises at least one Hall sensor disposed along the preset direction, and the at least one Hall sensor is configured to detect a magnetic field strength of the magnetic head and determine the position of the sliding member relative to the fixed member.

10. An electronic device, comprising:

a switch, comprising:

a fixed member, comprising a sensor module;

a sliding member, spaced apart from the fixed member and movable along a preset direction relative to the fixed member; wherein the sliding member comprises a magnetic head, and the magnetic head at least partially overlaps with the sensor module, so that the sensor module is able to determine a position of the sliding member relative to the fixed member; and a processor, electrically connected to the sensor module; wherein the processor makes the switch be in a corresponding operating mode according to the position of the sliding member relative to the fixed member; and a middle frame, comprising:

a middle plate; and a side frame, wherein the side frame extends from an edge of the middle plate, the side frame and the middle plate are enclosed to define an accommodating chamber, the fixed member and the processor of the switch are accommodated in the accommodating chamber, and the sliding member of the switch is disposed on the side frame;

the sensor module comprises a plurality of magnetoresistive sensors disposed along the preset direction, and the plurality of magnetoresistive sensors are sequentially connected in series;

the sliding member moves relative to the fixed member along the preset direction, so that the magnetic head sequentially passes by at least one magnetoresistive sensor;

the magnetic head magnetizes the at least one magnetoresistive sensor that is passed by the magnetic head and changes a resistance value of the at least one magnetoresistive sensor that is passed by the magnetic head, so that a total resistance value of the sensor module changes;

the processor determines the position of the sliding member relative to the fixed member according to the total resistance value of the sensor module, and makes the switch be in the corresponding operating mode; and a distance of the sliding member relative to the fixed member is linearly related to the total resistance value of the sensor module.

11. The electronic device according to claim 10, wherein the plurality of magnetoresistive sensors are disposed at equal intervals.

12. The electronic device according to claim 11, wherein when the sliding member is located at a first position of the fixed member, the switch is in a first operating mode;

when the sliding member is located at a second position of the fixed member, the switch is in a second operating mode; and when the sliding member is located at a third position of the fixed member, the switch is in a third operating mode.

13. The electronic device according to claim 12, wherein the first position, the second position, and the third position are disposed at equal intervals along the preset direction.

14. The electronic device according to claim 10, wherein each of the plurality of magnetoresistive sensors comprises a barrier layer, a first magnetic layer, and a second magnetic layer;

the barrier layer comprises two opposite side surfaces, the first magnetic layer is located on one of the two opposite side surfaces, and the second magnetic layer is located on the other of the two opposite side surfaces;

the magnetic head is configured to magnetize the second magnetic layer, and a magnetic field strength of the magnetic head is greater than a preset magnetic field strength.

15. The electronic device according to claim 14, wherein when a magnetic field direction of the second magnetic layer is consistent with that of the first magnetic layer, each of the plurality of magnetoresistive sensors has a first resistance value;

when the magnetic field direction of the second magnetic layer is opposite to that of the first magnetic layer, each of the plurality of magnetoresistive sensors has a second resistance value; and the magnetic field direction of the second magnetic layer is consistent or opposite to a moving direction of the magnetic head, and the first resistance value is less than the second resistance value.

16. The electronic device according to claim 15, wherein the magnetic head is one of a permanent magnet and an electromagnet.

17. The electronic device according to claim 10, wherein the sensor module comprises at least one Hall sensor disposed along the preset direction, and the at least one Hall sensor is configured to detect a magnetic field strength of the magnetic head and determine the position of the sliding member relative to the fixed member.

18. The electronic device according to claim 10, wherein a surface of the side frame away from the accommodating chamber is recessed to define a sliding groove, and the sliding member is accommodated and slidable in the sliding groove, so that the sliding member slides along the preset direction relative to the fixed member.

* * * * *